(12) United States Patent
Bharti et al.

(10) Patent No.: US 8,836,201 B2
(45) Date of Patent: Sep. 16, 2014

(54) ELECTROACTIVE POLYMERS AND ARTICLES CONTAINING THEM

(75) Inventors: Vivek Bharti, Cottage Grove, MN (US); Thu-Van T. Tran, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 428 days.

(21) Appl. No.: 13/141,800

(22) PCT Filed: Nov. 19, 2009

(86) PCT No.: PCT/US2009/065028
§ 371 (c)(1),
(2), (4) Date: Jun. 23, 2011

(87) PCT Pub. No.: WO2010/077465
PCT Pub. Date: Jul. 8, 2010

(65) Prior Publication Data
US 2011/0254408 A1    Oct. 20, 2011

Related U.S. Application Data

(60) Provisional application No. 61/141,352, filed on Dec. 30, 2008.

(51) Int. Cl.
| | |
|---|---|
| H01L 41/047 | (2006.01) |
| H01L 41/193 | (2006.01) |
| C08F 220/18 | (2006.01) |
| H01L 37/02 | (2006.01) |
| C08F 220/36 | (2006.01) |
| C09D 4/06 | (2006.01) |
| C08F 222/06 | (2006.01) |
| C08F 222/10 | (2006.01) |

(52) U.S. Cl.
CPC ............ *H01L 37/025* (2013.01); *H01L 41/193* (2013.01); *C08F 222/06* (2013.01); *C08F 220/18* (2013.01); *C08F 220/36* (2013.01); *C09D 4/06* (2013.01); *C08F 222/1006* (2013.01)
USPC .......................................... 310/328; 310/365

(58) Field of Classification Search
CPC .... H01L 41/083; H01L 41/09; H01L 41/0926
USPC .................................................. 310/328, 365
See application file for complete search history.

(56) References Cited

U.S. PATENT DOCUMENTS 5,028,395 A * 7/1991 Sebille et al. .............. 422/82.06
6,355,749 B1    3/2002 Chung
(Continued)

FOREIGN PATENT DOCUMENTS

| | | |
|---|---|---|
| JP | 10017622 | 1/1998 |
| WO | WO 03/102218 | 12/2003 |
| WO | WO 2008/114810 A1 | 9/2008 |

OTHER PUBLICATIONS

Huang, "High-dielectric-constant all-polymer percolative composites", Applied Physics Letters, May 19, 2003, vol. 82, No. 20, pp. 3502-3504.

Kofod, "Actuation Response of Polyacrylate Dielectric Elastomers", Journal of Intelligent Material Systems and Structures, Dec. 2003, vol. 14, No. 12, pp. 787-793.

(Continued)

*Primary Examiner* — Derek Rosenau
*Assistant Examiner* — Bryan Gordon
(74) *Attorney, Agent, or Firm* — Eric E. Silverman

(57) ABSTRACT

An electroactive polymer device is described that includes at least one layer of a dielectric polymer that is a polymerized product of at least one ethylenically unsaturated nitrogen-containing monomer. Also disclosed is a transducer that includes the electroactive polymer as disclosed.

19 Claims, 1 Drawing Sheet

(56) References Cited

U.S. PATENT DOCUMENTS

| | | | |
|---|---|---|---|
| 6,376,971 B1 | 4/2002 | Pelrine | |
| 6,423,412 B1* | 7/2002 | Zhang et al. | 428/421 |
| 6,902,740 B2 | 6/2005 | Schaberg | |
| 2001/0026165 A1 | 10/2001 | Pelrine | |
| 2002/0161074 A1 | 10/2002 | Zhang | |
| 2003/0113365 A1* | 6/2003 | Schaberg et al. | 424/449 |
| 2003/0149133 A1* | 8/2003 | Lau et al. | 523/160 |
| 2006/0039934 A1* | 2/2006 | Ness et al. | 424/401 |
| 2007/0222344 A1* | 9/2007 | Kornbluh et al. | 310/800 |
| 2008/0224566 A1 | 9/2008 | Bharti | |
| 2010/0254837 A1* | 10/2010 | Boersma et al. | 417/413.2 |

OTHER PUBLICATIONS

Pelrine, "Electrostriction of polymer dielectrics with compliant electrodes as a means of actuation", Sensors and Actuators A, Jan. 1998, vol. 64, No. 1, pp. 77-85.

Pelrine, "High-Speed Electrically Actuated Elastomers with Strain Greater Than 100%", Science, Feb. 4, 2000, vol. 287, pp. 836-839.

Zhenyi, "High Field Electrostrictive Response of Polymers", Journal of Polymer Science: Part B: Polymer Physics, 1994, vol. 32, pp. 2721-2731.

International Search Report for PCT/US2009/065028, 4 pages.

* cited by examiner

US 8,836,201 B2

ELECTROACTIVE POLYMERS AND ARTICLES CONTAINING THEM

CROSS REFERENCE TO RELATED APPLICATIONS

This application is a national stage filing under 35 U.S.C. 371 of PCT/US2009/065028, filed Nov. 19, 2009, which claims priority to Provisional Application No. 61/141,352, filed Dec. 30, 2008, the disclosure of which is incorporated by reference in its/their entirety herein.

FIELD

The present disclosure relates to electrically responsive elements and articles including such electrically responsive elements.

BACKGROUND

Electroactive materials, also referred to as electrically responsive materials, such as polymers are used in numerous applications. Exemplary applications include, but are not limited to, robotics applications, pumps, speakers and prosthetic devices. The lower the necessary electrical energy input of a material, the more energy efficient the device can be; therefore, there remains a need for materials that have a relatively large mechanical response to a relatively small energy input.

BRIEF SUMMARY

Disclosed herein is an electroactive polymer device that includes at least one layer of a dielectric polymer formed from at least an ethylenically unsaturated nitrogen-containing monomer with the proviso that the ethylenically unsaturated nitrogen-containing monomer is not acrylonitrile. The electroactive polymer device is selected from a piezoelectric device, pyroelectric device, actuator, transducer, or sensor.

Also disclosed herein is a transducer for converting between electrical energy and mechanical energy that includes an actuating component, the actuating component having at least one layer of a dielectric polymer formed from at least an ethylenically unsaturated nitrogen-containing monomer with the proviso that the ethylenically unsaturated nitrogen-containing monomer is not acrylonitrile; a first electrode, electrically connected to the actuating component; and a second electrode, electrically connected to the actuating component. Upon application of an electric field across the actuating component, the at least one layer of the dielectric polymer is mechanically displaced.

BRIEF DESCRIPTION OF THE DRAWINGS

The disclosure may be more completely understood in consideration of the following detailed description of various embodiments of the disclosure in connection with the accompanying drawings, in which.

Figure 1:
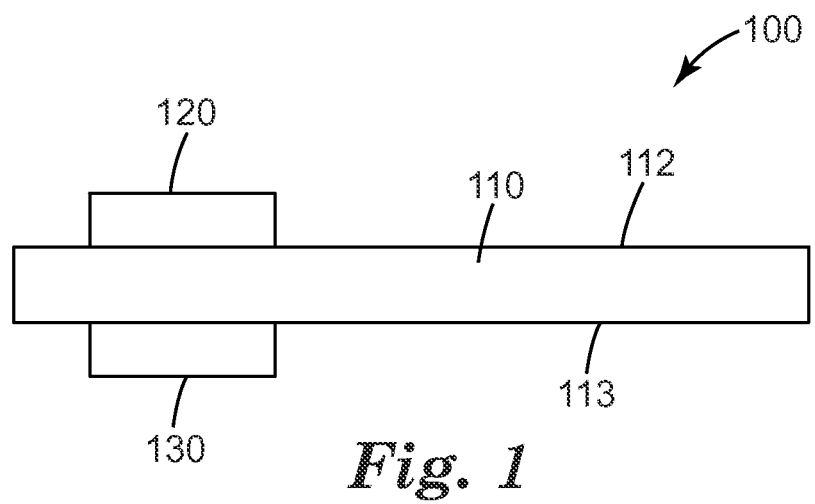
FIG. 1 depicts an exemplary transducer as disclosed herein.

In the following description, reference is made to the accompanying drawing that forms a part hereof, and in which are shown by way of illustration a specific embodiment. It is to be understood that other embodiments are contemplated and may be made without departing from the scope or spirit of the present disclosure. The following detailed description, therefore, is not to be taken in a limiting sense.

DETAILED DESCRIPTION

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Disclosed herein are electroactive polymers and devices including such polymers. Examples of such devices include, but are not limited to, piezoelectric devices, pyroelectric devices, actuators and sensors. Electrical voltage applied to such articles can deform the article, or the electroactive polymer included therewith; or alternatively when the article is under a mechanical stress, an electrical voltage may be produced.

An electroactive polymer is a polymer that exhibits a mechanical response, such as stretching, contracting or bending for example, in response to an electric field; or a polymer that produces energy in response to a mechanical stress. An exemplary electroactive polymer device as disclosed herein includes at least one layer of a dielectric polymer formed from at least an ethylenically unsaturated nitrogen-containing monomer.

An embodiment disclosed herein includes at least one layer of a polymer. The at least one layer can have any useful thickness for formation of an electrical device, such as an actuator. In an embodiment, the at least one layer can have a thickness of at least 0.1 micrometer (μm), at least 0.2 μm, at least 0.5 μm, at least 1 μm, at least 10 μm, or at least 50 μm. The at least one layer can have a thickness up to 1000 μm, up to 500 μm, up to 200 μm, or up to 100 μm. The thickness can be, for example, from about 0.01 micrometers to about 1000 μm, from about 0.1 to 500 μm, or from about 0.1 μm to about 100 μm.

An electrical device or an actuator can also include multiple layers of polymer. In an embodiment, all of the multiple layers can include the dielectric polymer. In an embodiment, not all of the multiple layers include the dielectric polymer. In an embodiment, an electrical device or an actuator can include a plurality of polymer layers. In an embodiment, an electrical device or an actuator can include from about 2 to about 10 polymer layers. An exemplary method of fabricating a multilayer device can be fond in U.S. Patent Publication No. 20080224566, entitled "Multilayer Conductive Elements", published on Sep. 18, 2008.

The polymer can be formed from one or more than one kind of monomer. A monomer, as that term is used herein is any molecule that is capable of being polymerized with itself or a different monomer. A polymer formed from only one kind of monomer is a homopolymer. A polymer formed from more than one kind of monomer is a copolymer.

The at least one monomer includes a nitrogen-containing group and an ethylenically unsaturated functionality and is referred to herein as an ethylenically unsaturated nitrogen-containing monomer. In an embodiment, only an ethylenically unsaturated nitrogen-containing monomer is reacted forming a homopolymer. In an embodiment, an ethylenically unsaturated nitrogen-containing monomer is reacted with an ethylenically unsaturated co-monomer forming a copolymer.

The ethylenically unsaturated nitrogen-containing monomer contains a nitrogen-containing group and an ethylenically unsaturated group. "Ethylenically unsaturated functionality" as that phrase is utilized herein refers to a double bond at the end of a molecule (e.g. either a double bond between the last two carbons or a double bond between the first two carbons). Exemplary structures that can be included in ethylenically unsaturated groups are (meth)acryloyl groups or vinyl groups.

The nitrogen-containing group of the monomer can have any suitable chemical configuration. The nitrogen-containing group can be a cyclic structure or a linear structure. In many suitable cyclic nitrogen-containing groups, nitrogen is one of the ring atoms of the cyclic structure. Exemplary cyclic groups that contain a nitrogen ring atom include, but are not limited to, a pyrrolidonyl group, a pyrrolyl group, a pyrazolyl group, an imidazolyl group, a pyridinyl group, a pyridazinyl group, a pyrimidinyl group, a pyrazinyl group, a piperazinyl group, a triazinyl group and a caprolactamyl group. The cyclic groups can be directly or indirectly attached to the ethylenically unsaturated group. Some such monomers can be compounds of Formula (I) or Formula (II).

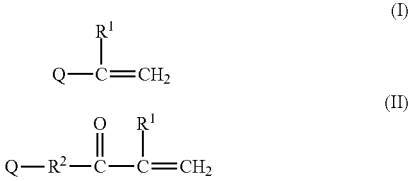

In these formulas, $R^1$ is hydrogen or alkyl such as alkyl having 1 to 10 carbon atoms, 1 to 8 carbon atoms, 1 to 6 carbon atoms, or 1 to 4 carbon atoms. Group $R^2$ is a single bond or an alkylene such as an alkylene having 1 to 10 carbon atoms, 1 to 8 carbon atoms, 1 to 6 carbon atoms, or 1 to 4 carbon atoms. Group Q is a nitrogen-containing cyclic group having 4 to 8 ring atoms. The group Q can be saturated, partially saturated, or unsaturated. The ring atoms are typically nitrogen or carbon. The nitrogen-containing cyclic group typically has at least one nitrogen ring atom. A nitrogen ring atom is typically bonded to the group —$C(R^1)$=$CH_2$ in Formula (I) or to the $R^2$ group in Formula (II).

Specific monomers of Formula (I) include, but are not limited to, N-vinylpyrrolidone, N-vinylpyrrole, N—N-vinylimidazole, N-vinylpyridine, and N-vinylcaprolactam. Specific monomers of Formula (II) include, but are not limited to, pyrrolidone ethyl acrylate.

Some exemplary nitrogen-containing monomers are of Formula (III).

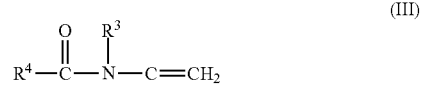

In Formula (III), the ethylenically unsaturated group is a vinyl group. Group $R^3$ can be hydrogen, an alkyl group, or a group that combines with $R^4$ to form a saturated, partially saturated, or unsaturated cyclic group. Group $R^4$ can be an alkyl or a group that combines with $R^3$ to form a cyclic group. The cyclic group often has 4 to 8 ring atoms. The ring atoms are typically carbon or nitrogen. Suitable alkyl groups often have 1 to 10 carbon atoms, 1 to 6 carbon atoms, or 1 to 4 carbon atoms. Monomers of Formula (III) where $R^3$ and $R^4$ combine to form a cyclic group are a subset of the monomers of Formula (I).

Examples of Formula (III) where $R^3$ and $R^4$ combine to form a cyclic structure include, but are not limited to, N-vinylcarprolactam and N-vinylpyrrolidone. Examples of Formula (III) where $R^4$ is an alkyl and $R^3$ is hydrogen or alkyl include N-vinylacetamide and N-vinyl-N-methylacetamide.

The at least one ethylenically unsaturated nitrogen-containing monomer can optionally be reacted with an ethylenically unsaturated co-monomer. One or more than one kind of (e.g. a mixture of two or more) ethylenically unsaturated co-monomers can be utilized. Exemplary ethylenically unsaturated co-monomers include, but are not limited to, isobornyl acrylate, butadiene (1,3-butadiene), isooctyl acrylate, n-octyl acrylate, 2-ethylhexyl acrylate (2-EHA), and isobutyl acrylate (IBOA). Other exemplary co-monomers can include various vinyl esters such as vinyl acetate.

In an embodiment where only one kind of monomer is utilized, i.e. an ethylenically unsaturated nitrogen-containing monomer, the monomer can be pyrrolidone ethyl acrylate. Pyrrolidone ethyl acrylate is a monomer that includes both a pyrrolidinyl group and a vinyl group. Pyrrolidone ethyl acrylate can also be combined with either another ethylenically unsaturated nitrogen-containing monomer or an ethylenically unsaturated co-monomer to form a copolymer.

Exemplary homopolymers as described herein can include, but are not limited to, polymerized pyrrolidone ethyl acrylate. Exemplary copolymers as described herein can include, but are not limited to, copolymers of N-vinyl pyrrolidone (NVP) and isooctyl acrylate (IOA); copolymers of N-vinyl acetamide (NVA) and isooctyl acrylate (IOA); copolymers of N-vinyl imidazole (NVI) and isooctyl acrylate (IOA); copolymers of N-vinyl caprolactam (NVC) and isooctyl acrylate (IOA); copolymers of pyrrolidone ethyl acrylate (PYEA) and isooctyl acrylate (IOA); copolymers of N-vinyl pyrrolidone (NVP) and isobornyl acrylate (IBOA); copolymers of N-vinyl acetamide (NVA) and isobornyl acrylate (IBOA); copolymers of N-vinyl imidazole (NVI) and isobornyl acrylate (IBOA); copolymers of N-vinyl caprolactam (NVC) and isobornyl acrylate (IBOA); and copolymers of pyrrolidone ethyl acrylate (PYEA) and isobornyl acrylate (IBOA).

In embodiments where the electroactive polymer is a copolymer formed of at least two monomers, an ethylenically unsaturated nitrogen-containing monomer and an ethylenically unsaturated co-monomer, the amounts of the two monomers can vary. In an embodiment, the weight ratio of ethylenically unsaturated nitrogen-containing monomer to ethylenically unsaturated co-monomer is from about 20:80 to about 60:40. In an embodiment, the weight ratio of ethylenically unsaturated nitrogen-containing monomer to ethylenically unsaturated co-monomer is from about 30:70 to about 50:50.

The electroactive polymer (homopolymer or copolymer) can also be crosslinked. A crosslinked polymer may offer greater durability than a non-crosslinked polymer. A crosslinked polymer may also positively effect the viscoelastic properties and possibly improve the electrical breakdown strength. Known methods of crosslinking can be utilized. For example, the polymer can be physically crosslinked or chemically crosslinked. Crosslinking can be initiated by heat, pressure, or radiation for example. In an embodiment where the polymer is chemically crosslinked, various known chemical crosslinking agents can be utilized. The particular chemical crosslinking agent utilized can depend at least in part on the particular monomer(s) utilized, the respective amounts of monomers (if applicable), the degree of crosslinking desired, other factors not discussed herein, or combinations thereof.

Exemplary chemical crosslinking agents that can be utilized include, but are not limited to, multifunctional acrylates. In an embodiment, specific exemplary crosslinking agents that can be utilized include, but are not limited to, polybutadiene diacrylate, pentaacrylate ester, triethylene glycol diacrylate, ethoxylated bisphenol A dimethylacrylate, diethylene glycol diacrylate, hexanediol diacryalte, tris 2-hydroxy ethyl isocyanurate triacrylate (THEIC), multifunctional acrylates such as trimethylol propane triacrylate (TMPTA) and combinations thereof. The amount of chemical crosslinking agent that can be utilized can depend at least in part on the particular agent utilized, the amounts of the monomer(s), the degree of crosslinking desired, other factors not discussed herein, or combinations thereof. In an embodiment, a chemical crosslinking agent can be used in an amount from about 0.1 parts per hundred parts of resin (phr) to about 100 phr. In an embodiment, a chemical crosslinking agent can be used in an amount from about 0.2 phr to about 50 phr. In an embodiment, the chemical crosslinking agent can be used in an amount from about 0.2 phr to about 20 phr. In other embodiments, the chemical crosslinking agent can be used in an amount from about 0.1 phr to about 10 phr or from about 0.1 phr to about 5 phr. The crosslinker that is utilized can effect the modulus of the final polymer, generally, more advantageous electroresponsive properties can be had from a polymer that is neither too tightly nor too loosely crosslinked. The crosslinker that is utilized can also have a response to applied electric fields.

The electroactive polymer (homopolymer or copolymer) may also include other additives. Additives may optionally be utilized in order to affect certain properties of the polymer. One type of additives that may be utilized are additives that enhance or tailor the electroresponsive properties of the electroactive polymer, referred to herein as electroresponsive additives. Exemplary electroresponsive additives include organic additives (polymer blends) such as polyolefins, elastomers, polyurethane, silicones, poly(vinylidine fluorides) or acrylic copolymers. Exemplary electroresponsive additives include inorganic additives (polymer composites) such as metal oxides, $BaTiO_3$, lead zirconate titanate (PZT) and lead magnesium niobate-lead titanate (PMN-PT). Other additives that may be utilized include, but are not limited to cyanoethyl acrylate-polymethyl methacrylate copolymer (CEA-MMA).

An electroactive polymer as disclosed herein can be included in a transducer. A transducer is a device that can convert between electrical energy and mechanical energy or vice versa. The structure and fabrication of transducers and other electrical devices that include electroactive polymers as disclosed herein are generally known to those of skill in the art. The electroactive polymers disclosed herein can be utilized in known transducer structures to provide advantageous results.

An exemplary transducer is shown in FIG. 1. A transducer 100 as disclosed herein can include an actuating component 110, a first electrode 120 and a second electrode 130. The first electrode 120 and second electrode 130 are generally electrically conductive and are configured to be electrically connected to the actuating component 110. The first electrode 120 and second electrode 130 can include a single component or more than one component. The first electrode 120 and second electrode 130 can include electrically conductive material that is electrically connected to the actuating component and are also configured to be electrically connected to a source of electrical energy.

In the embodiment depicted in FIG. 1, the first electrode 120 and second electrode 130 can be disposed adjacent to the actuating component 110. In an embodiment, the first electrode 120 and the second electrode 130 can be disposed directly adjacent to the actuating component 110. In an embodiment, the first electrode 120 and the second electrode 130 can be electrically connected to opposite surfaces of the actuating component 110. For example, the first electrode 120 can be disposed adjacent to a first surface 112 of the actuating component 110; and the second electrode 130 can be disposed adjacent to a second surface 113 of the actuating component 110. Although FIG. 1 shows the first electrode 120 and the second electrode 130 disposed directly across from each other on opposing surfaces of the actuating element, this need not be the case and they can be offset on opposing surfaces of the actuating element. The first electrode 120 and second electrode 130 also need not cover the surfaces of the actuating component 110 and can be intermittently located on the surfaces of the actuating component 110, as seen in US. Patent Publication No. 20080224566, entitled "MULTILAYER CONDUCTIVE ELEMENTS", the disclosure of which is incorporated herein by reference.

Figure 2:
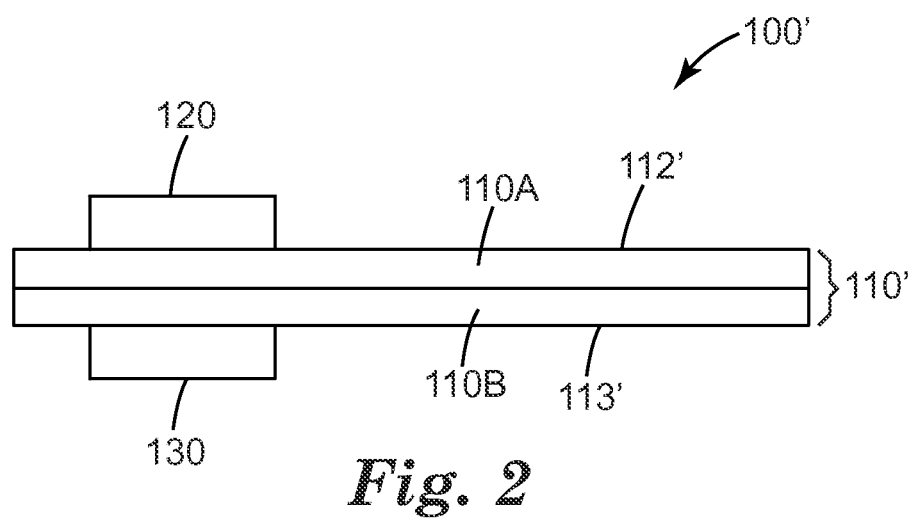
FIG. 2 depicts an exemplary transducer as disclosed herein.
The figure is not necessarily to scale.

Another embodiment of an exemplary transducer is shown in FIG. 2. A transducer 100' as disclosed herein can include an actuating component 110', first electrode 120 and a second electrode 130. In transducer 100', actuating component 110', first surface 112' and second surface 113' correspond generally to the like-numbered components for transducer 100 in FIG. 1. Actuating component 110' can include a plurality of layers of electroactive polymers, for example, a plurality of layers including electroactive polymer layer 110A and electroactive polymer layer 110B. The first electrode 120 and the second electrode 130 can be made of any electrically conductive material. Exemplary conductive materials can include, but are not limited to, solder, other conductive metals, conductive polymers and polymers containing conductive fillers. In an embodiment, the first electrode 120 and the second electrode 130 can be made of a non-metallic electrically conductive material and can be configured to be in contact with a metallic material that is or is electrically connected to a source of electrical energy. Exemplary electrically conductive materials can include, but are not limited to, conductive metals and conductive polymers. Exemplary conductive metals can be chosen from copper, silver, gold, platinum, aluminum or mixtures thereof. Exemplary conductive polymers can be chosen from poly(acetylene)s, poly(pyrrole)s, poly(thiophene)s, poly(aniline)s, poly(fluorene)s, poly(3-alkylthiophene)s, polytetrathiafulvalenes, polynaphthalenes, poly(p-phenylene sulfide), poly(para-phenylene vinylene)s, or mixtures thereof. Polymers that can be made to be conductive can also be utilized. Exemplary methods of rendering a non-conductive polymer conductive include, but are not limited to, the inclusion of conductive particles or doping. Specific exemplary materials include, but are not limited to, CLEVIOS™ conductive polymers (formerly known as Baytron conductive polymers, H. C. Starck GmbH, Goslar, Germany and prepared from the monomer 3,4-ethylendioxythiophene), graphite and carbon grease (MG Chemicals, Surrey, British Columbia). In an embodiment, first and second electrodes can include a sputter deposited conductive metal, such as gold for example.

Disclosed herein is a transducer that converts between electrical energy and mechanical energy, the transducer includes an actuating component that includes at least one layer of a dielectric polymer formed from at least an ethylenically unsaturated nitrogen-containing monomer; a first electrode that is electrically connected to the actuating component; and a second electrode that is electrically connected to the actuating component, wherein upon application of an electric field across the actuating component, the at least one layer of the polymer is mechanically displaced.

Transducers, or other electrical devices disclosed herein can also include other optional components, some discussed herein and some not specifically discussed herein. For example, an electrical device can include multiple layers of electroactive polymers (those discussed herein as well as others) or other polymeric materials (both conductive and non-conductive) for example.

The at least one layer of electroactive polymer can exhibit a mechanical response (stretching, contracting, or bending) in response to an electric field. It is thought, but not relied upon that when a voltage is applied across the two electrodes that are electrically connected to the at least one electroactive polymer layer, positive charges appear on one electrode and negative charges appear on the other electrode. These electrostatic charges attract each other and bring the two electrodes together, thus causing a reduction in thickness of the electroactive polymer layer (displacement or strain). Since the Poison's ratio of the electroactive polymer layer has to be constant, the thickness reduction causes mechanical response (i.e. movement) in other free directions of the electroactive polymer layer. The property of thickness reduction is known as an actuator property.

The actuator property of some electroactive polymers, such as those polymers disclosed herein has been attractive for a broad range of potential applications, including but not limited to, robotic arms, grippers, loudspeakers, active diaphragms, dust wipers, heel strikers (dental) and numerous automotive applications. There are also numerous applications within the medical field including but not limited to, artificial muscles, synthetic limbs or prostheses, wound pumps, active compressing socks and catheter or other implantable medical device steering elements.

Electroactive polymers as disclosed herein can offer advantageous properties, especially in comparison with previously utilized electroactive polymers. For example, electroactive polymers as disclosed herein can have a high modulus of elasticity (or Young's modulus which is also referred to herein simply as "modulus"). The modulus of a material is an indication of the stiffness of a material. The modulus can be quantified using the units megapascals (MPa). The modulus is the stress of a material divided by its strain; or put another way how much a material yields for the amount of load put upon it.

Modulus can be measured as is known to those of skill in the art, including the use of a Dynamic Mechanical Analyzer (DMA). An exemplary method of measuring modulus is shown in the Examples. In an embodiment, an electroactive polymer is considered to have a high modulus of it has a measured modulus of at least about 100 MPa.

Electroactive polymers as described herein can also offer the advantage of having a relatively high displacement in light of the applied electric field. In an embodiment, the displacement can be measured using a photonic sensor model number MTI-2000 from MTI Instruments Inc., Albany USA. In an embodiment, the strain is defined as the ratio of the change in the thickness under the electrical field with and the initial thickness of film. Generally, strain does not have any units. The electrical field strength was measured by dividing the applied voltage by the thickness of the film. In all examples the units of electrical field of MV/m is used. The ratio of electrically induced strain with the applied electrical field (S/EF) can be used to compare actuator properties of various films. In an embodiment, S/EF of an electroactive polymer can be less than or equal to about 0.3.

Electroactive polymers as described herein can also offer a processing advantage when compared with most previously utilized electroactive polymers. Most previously utilized electroactive polymers generally require that the polymer be "pre-strained" before use. This generally encompasses changing the dimensions of a film in one or more direction. It can be accomplished by stretching the polymer in tension and fixing one or more of the edges while it is stretched. Pre-straining in other electroactive polymers is undertaken in order to improve the conversion between electrical and mechanical energy and improve the strength of the polymer. The electroactive polymers disclosed herein offer the advantage of not needing to be pre-strained. Even without pre-straining, the electroactive polymers disclosed herein offer advantageous conversion between electrical and mechanical energy and mechanical properties. This can make the fabrication of devices including the electroactive polymers disclosed herein easier and likely more cost effective.

EXAMPLES

Materials and Methods

Unless otherwise noted, all chemicals were obtained from Aldrich and were used without further purification.

Preparation of Pyrrolidonoethyl Acrylate (PYEA)

Further details can be found in U.S. Pat. No. 6,902,740 (Schaberg et al.), the disclosure of which is incorporated herein by reference. A 1 liter three-neck round bottom flask was equipped with a paddle stirrer, thermometer with temperature controller, Dean Stark trap with a water cooled condenser and electric heating mantle. To this flask was added N-(hydroxyethyl)pyrrolidin-2-one (260 g, 2 moles), acrylic acid (290 g, 4 moles), toluene (300 mL), p-toluenesulfonic acid hydrate (26 g, 0.14 mole), 4-methoxyphenol (2 g) and copper powder (1 g). Stirring was started and heat was applied to the flask contents so that toluene refluxed into the condenser. During the course of the esterification reaction (4.5 hours) approximately 122 mL of water was collected in the trap. The reaction vessel contents were concentrated on a rotoevaporator to provide crude product as a brown liquid. This liquid was distilled under vacuum through a 6 inch (15.2 cm) Vigreux column/water cooled condenser. The first fraction of distillate (acrylic acid) was discarded, after which the PYEA was collected at a boiling point of 115-120° C. at a pressure of 0.2 mm mercury. 260 g of PYEA as a water white liquid was obtained. Analysis by nuclear magnetic resonance spectroscopy showed that this material was 95% pure. The purity level of each lot of PYEA and the desired weight ratio of PYEA are used to determine the amount of PYEA used in the synthesis of a particular copolymer.

IOA is iso-octyl acrylate that is commercially available under the trade name SR-440 from Sartomer, West Chester, Pa.

IBOA is isobornyl acrylate that is commercially available under the trade name SR-506 from Sartomer, West Chester, Pa.

N-vinyl caprolactam (NYC), N-vinyl pyrrolidone (NVP), N-vinyl Imidazole (NVI) and N-vinyl acetamide (NV) all are available from Aldrich, Milwaukee, Wis.

pBDDA is polybutadiene diacrylate that is commercially available under the trade name BAC-15 from San Esters Corp., New York, N.Y.

CEA-MAA is cyano ethylacrylate-methylmethacrylate copolymer that is available from 3M in Saint Paul, Minn. under the trade designation 3M Scotch-Weld Instant Adhesive.

TMPTA is trimethyloylpropane triacrylate that is commercially available under the trade designation SR-531 from Sartomer, West Chester, Pa.

THEI-TA is tris(2-hydroxylethyl) isocyanurate triacrylate that is commercially available under the trade name SR-368 from Sartomer West Chester, Pa.

PTeA is petaerythritol tetraacrylate that is commercially available under the trade name SR-295 from Sartomer West Chester, Pa.

PA is Pentaacrylate Ester (trade name SR-9041), Sartomer West Chester, Pa.

TrEGDA is triethylene glycol diacrylate that is commercially available under the trade name SR-272 from Sartomer West Chester, Pa.

EO4BisA DMA is ethoxylated 4-bisphenol A dimethacrylate that is commercially available under the trade name CD-540 from Sartomer West Chester, Pa.

DEGDA refers to diethylene glycol diacrylate. This material is commercially available under the trade name SR-230 from, Sartomer West Chester, Pa.

pU refers to a thermoplastic polyurethane that is available under the trade designation TEXIN from Bayer Material Science LLC, Pittsburgh, Pa.

Preparation of liner support. A high nitrile butadiene rubber (HNBR) was used that is commercially available under the trade designation ZETPOL 1010 from Zeon Corporation, Tokyo, JAPAN. The HNBR is a highly saturated copolymer of butadiene and acrylonitrile from) was dissolved at about 10% of solid content in toluene. The solution was coated onto polyethylene phthalate film treated with silicone release (CP Film Inc. Fieldale, Va.) at a thickness gap to yield about 0.5 mil thick film after dry in a heated oven at 70° C. for about 5 minutes.

Testing Methods

The modulus was measured by placing a sample having a thickness of about 2 mm and 8 mm$^2$ on a rheology analyzer (commercially available from Rheometric Scientific, Inc., Piscataway, N.J. under the trade designation "2980 DMA") and measurements are made in sandwich mode at a frequency of 0.1 Hz and a strain of 0.2% over a temperature range of −100° C. to 200° C. The storage modulus G' was recorded at 25° C.

The glass transition temperatures were measured at the phase change from glassy to rubbery.

The ratio of strain over electric field (S/EF) includes both the strain and the electric field. The displacement can be measured using a photonic sensor model number MTI-2000 from MTI Instruments Inc., Albany USA. The strain is defined as the ratio of the change in the thickness under the electrical field with and the initial thickness of film. Generally, strain does not have any units. The electrical field strength was measured by dividing the applied voltage by the thickness of the film. In all examples the units of electrical field of MV/m is used. The ratio of electrically induced strain with the applied electrical field (S/EF) can be used to compare actuator properties of various films.

COMPARATIVE EXAMPLES

Table 1 provides maximum strain and electric field ratios measured in various references for various materials. The value for the irradiated P(VDF-TrFe) is from U.S. Pat. No. 6,423,412. The value for the P(VDF-TrFE) and CuPC composite film is from United States Patent Publication No. 20020161074. The value for the P(VDF-TrFE-CTFE) film is from U.S. Pat. No. 6,355,749. The value for P(VDF-TrFE-CTFE) & PANI composite is from Appl. Phys. Lett., vol. 82, pp. 3503 (2003). The value for VHB is from Science, vol. 287, pp. 836, (2000). The value for polyurethane is from J. Polym. Sci: Part B: Polym. Phys., vol 32, pp 2721 (1994). The value for silicone is from Sensors & Actuators, vol. 64, pp. 77, (1998).

TABLE 1

| Material | Maximum thickness strain (%) Field (V/μm) |
|---|---|
| Irradiated P(VDF-TrFE) | 0.025 |
| P(VDF-TrFE) and CuPC composite film | 0.15 |
| P(VDF-TrFE-CTFE) | 0.029 |
| P(VDF-TrFE-CTFE) & PANI composite | 0.16 |
| VHB | 0.15 |
| Polyurethane | 0.18 |
| Silicone | 0.57 |

Example 1

Each electroactive polymer film was prepared as follows. A syrup was prepared from an initial mixture of isooctyl acrylate (IOA) and the other comonomers listed in Table 2 (except the last one that included only PYEA). 0.04 phr (parts per hundred parts of resin) amount of 2,2-dimethoxy-2-phenyl acetophenone initiator (0.04 phr) was added into the mixture (or PYEA). This initial mixture was partially polymerized by ultraviolet radiation under nitrogen atmosphere until the Brookfield viscosity was between 1000 and 3000 centipoise. Following partial polymerization, an additional amount of 2,2-dimethoxy-2-phenyl acetophenone initiator (0.2 phr) was added along with polybutadiene diacrylate (0.2 phr). The resulting was mixed thoroughly on a roller. A coating with a desired thickness of the syrup was applied to a liner support (ZETPOL 1010) and covered with a polyethylene phthalate film treated with silicon release (CP Film Inc. Fieldale, Va.). The coating was exposed to ultraviolet radiation light for a total dose of 900 mJ/cm2 for the curing process to take place.

The modulus, glass transition temperature and S/EF ratio were measured as discussed above.

TABLE 2

| Film Components | pBDDA (phr) | G' (MPa) | Tg (° C.) | Thickness (mm) | S/EF |
|---|---|---|---|---|---|
| 70% IOA/30% NVC | 0.2 | 107 | −3 | 0.17 | 0.76 |
| 70% IOA/30% NVP | 0.2 | 123 | −3 | 0.17 | 0.69 |
| 70% IOA/30% NVI | 0.2 | 258 | 15 | 0.20 | 0.26 |
| 70% IOA/30% NVA | 0.2 | 5570 | 35 | 0.14 | 0.29 |
| 100% PYEA | 0.2 | 561 | −7 | 0.20 | 0.47 |

Example 2

A film having 60 parts IBOA and 40 parts PYEA was prepared as in Example 1 above, except that 0.2 pph of a different crosslinker, TMPTA (Trimethyloylpropane Triacrylate) was used. The modulus was measured at 233 MPa and the S/EF ratio (both measured as discussed above) was 0.31.

Example 3

A thermoplastic polyurethane (commercially available under the trade designation TEXIN from Bayer Material Science LLC, Pittsburgh, which is an electroresponsive additive, was dissolved in an PYEA/IBOA mixture to form a syrup having a viscosity between 1000 and 3000 centipoise. Following the dissolution of the polyurethane methoxy-2-phenyl acetophenone initiator (0.2 phr) was added along with the other additives listed in Table 3 below. The resulting mixture was mixed thoroughly on a roller. A coating with a desired thickness of the syrup was applied between two polyethylene phthalate film treated with silicon release (CP Film Inc. Fieldale, Va.). The coating was exposed to ultraviolet radiation light for a total dose of 900 mJ/cm2 for the curing process. The modulus, glass transition temperature and S/EF ratio were measured as discussed above.

TABLE 3

| PYEA (parts) | IBOA (parts) | pU (phr) | TMPTA (phr) | CEA-MAA (phr) | THEI-TA (phr) | G' (MPa) | Tg (° C.) | Thickness (mm) | S/EF |
|---|---|---|---|---|---|---|---|---|---|
| 60 | 40 |  | 0.2 |  |  | 233 | 51 | 0.06 | 0.3 |
| 50 | 50 |  | 0.2 |  |  | 463 | 48 | 0.07 | 0.77 |
| 40 | 60 | 10 | 0.2 |  |  | 149 | 46 | 0.07 | 0.34 |
| 30 | 70 | 10 | 0.2 |  |  | 617 | 54 | 0.09 | 0.33 |
| 50 | 50 | 10 |  | 5 |  | 329 | 43 | 0.08 | 0.92 |
| 50 | 50 | 10 |  | 10 |  | 462 | 43 | 0.09 | 0.83 |
| 50 | 50 | 10 |  | 15 |  | 577 | 43 | 0.07 | 0.59 |
| 50 | 50 | 10 |  |  | 20 | 122 | 45 | 0.08 | 1.18 |
| 50 | 50 | 10 | 20 | 20 |  | 647 | 52 | 0.07 | 1.12 |

Example 4

Thermoplastic polyurethane (commercially available as TEXIN from Bayer Material Science LLC, Pittsburgh, Pa.) was dissolved in 100% PYEA monomer to form a syrup having a viscosity between 1000 and 3000 centipoise. Following the dissolution of the polyurethane, 2,2-dimethoxy-2-phenyl acetophenone initiator (0.2 phr) was added along with different types of crosslinkers listed in Table 4. The resulting mixture was mixed thoroughly on a roller. A coating with a desired thickness of the syrup was applied between two polyethylene phthalate film treated with silicon release (CP Film Inc. Fieldale, Va.). The coating was exposed to ultraviolet radiation light for a total dose of 900 mJ/cm2 for the curing process. The modulus, glass transition temperature and S/EF ratio were measured as discussed above.

TABLE 4

| PYEA (part) | pU (phr) | PETeA (phr) | PA (phr) | TrEGDA (phr) | EO4BisA DMA (phr) | DEGDA (phr) | G' (MPa) | Tg (° C.) | Thickness (mm) | S/EF |
|---|---|---|---|---|---|---|---|---|---|---|
| 100 | 10 | 20 |  |  |  |  | 204 | 38 | 0.10 | 0.32 |
| 100 | 10 |  | 50 |  |  |  | 1230 | 78 | 0.10 | 0.33 |
| 100 | 10 |  |  | 50 |  |  | 1178 | 52 | 0.12 | 0.59 |
| 100 | 10 |  |  |  | 40 |  | 802 | 58 | 0.12 | 0.54 |
| 100 | 10 |  |  |  |  | 50 | 1879 | 69 | 0.11 | 0.52 |

Thus, embodiments of electroactive polymers and articles containing them are disclosed. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. An electroactive polymer device comprising:
   at least one layer of a dielectric, electroactive polymer comprising a polymerized product of at least one ethylenically unsaturated nitrogen-containing monomer with the proviso that the ethylenically unsaturated nitrogen-containing monomer is not acrylonitrile, wherein the electroactive polymer device is selected from a piezoelectric device, pyroelectric device, actuator, transducer, or sensor wherein the electroactive polymer exhibits a mechanical response to an electric field or produces energy in response to a mechanical stress.

2. The device according to claim 1, wherein the dielectric polymer comprises the polymerized product of the ethylenically unsaturated nitrogen-containing monomer and an ethylenically unsaturated co-monomer.

3. The device according to claim 2, wherein the ethylenically unsaturated co-monomer contains an acrylic group.

4. The device according to claim 3, wherein the ethylenically unsaturated co-monomer is chosen from the group consisting of: isooctylacrylate, isobornylacrylate, 2-ethylhexyl acrylate, and combinations thereof.

5. The device according to claim 2, wherein the weight ratio of ethylenically unsaturated nitrogen-containing monomer to ethylenically unsaturated co-monomer is from about 20:80 to about 60:40.

6. The device according to claim 5, wherein the weight ratio of ethylenically unsaturated nitrogen-containing monomer to ethylenically unsaturated co-monomer is from about 30:70 to about 50:50.

7. The device according to claim 1, wherein the dielectric polymer is crosslinked.

8. The device according to claim 7, wherein the dielectric copolymer is crosslinked using a chemical crosslinker.

9. The device according to claim 8, wherein the chemical crosslinker is chosen from the group consisting of: polybutadiene diacrylate, pentaacrylate ester, triethylene glycol diacrylate, ethoxylated bisphenol A dimethylacrylate, diethylene glycol diacrylate, and combinations thereof.

10. The device according to claim 1 further comprising a plurality of layers of the dielectric polymer.

11. A transducer for converting between electrical energy and mechanical energy, the transducer comprising:
    an actuating component, the actuating component comprising at least one layer of a dielectric polymer comprising a polymerized product of at least one ethylenically unsaturated nitrogen-containing monomer with the proviso that the ethylenically unsaturated nitrogen-containing monomer is not acrylonitrile;
    a first electrode, electrically connected to the actuating component; and
    a second electrode, electrically connected to the actuating component,
    wherein upon application of an electric field across the actuating component, the at least one layer of the polymer is mechanically displaced.

12. The transducer according to claim 11, wherein the dielectric polymer comprises the polymerized product of the ethylenically unsaturated nitrogen-containing monomer and an ethylenically unsaturated co-monomer.

13. The transducer according to claim 12, wherein the ethylenically unsaturated co-monomer contains an acrylic group.

14. The transducer according to claim 12, wherein the ethylenically unsaturated co-monomer is chosen from the group consisting of: isooctylacrylate, isobornylacrylate, 2-ethylhexyl acrylate, and combinations thereof.

15. The transducer according to claim 11 further comprising a plurality of layers of the dielectric polymer.

16. The device according to claim 1, wherein the dielectric polymer is formed from only one kind of monomer.

17. The device according to claim 16, wherein the monomer is pyrrolidonoethyl acrylate.

18. The transducer according to claim 11, wherein the dielectric polymer is formed from only one kind of monomer.

19. The transducer according to claim 18, wherein the monomer is pyrrolidonoethyl acrylate.

* * * * *

UNITED STATES PATENT AND TRADEMARK OFFICE
CERTIFICATE OF CORRECTION

PATENT NO. : 8,836,201 B2  
APPLICATION NO. : 13/141800  
DATED : September 16, 2014  
INVENTOR(S) : Vivek Bharti Page 1 of 1

It is certified that error appears in the above-identified patent and that said Letters Patent is hereby corrected as shown below:

In the specification

Column 3
Line 1, Delete "fond" and insert -- found --, therefor.

Column 4
Lines 22-23, Delete "N-vinylcarprolactam" and insert -- N-vinylcaprolactam --, therefor.

Column 5
Lines 26-27, Delete "2-hydroxy ethyl" and insert -- 2-hydroxyethyl --, therefor.

Column 5
Line 56, Delete "poly(vinylidine fluorides)" and insert -- poly(vinylidene fluoride) --, therefor.

Column 9
Line 20, Delete "trimethyloylpropane" and insert -- trimethylolpropane --, therefor.

Column 10
Line 60 (Approx.), After "resulting" insert -- mixture --, therefor.

Column 11
Line 27 (Approx.), Delete "(Trimethyloylpropane" and insert -- (Trimethylolpropane --, therefor.

Signed and Sealed this  
Twenty-first Day of April, 2015

Michelle K. Lee  
*Director of the United States Patent and Trademark Office*